United States Patent [19]

Pelchat et al.

[11] Patent Number: 4,710,723
[45] Date of Patent: Dec. 1, 1987

[54] RECEIVER HAVING A MODULATION AMPLIFIER FOR ENHANCING RECEPTION OF A DESIRED SIGNAL IN THE PRESENCE OF INTERFERENCE

[75] Inventors: Guy Pelchat, Indialantic; Luther L. Crabtree, Melbourne, both of Fla.

[73] Assignee: Harris Corporation, Melbourne, Fla.

[21] Appl. No.: 848,269

[22] Filed: Apr. 4, 1986

[51] Int. Cl.$^4$ .................. H03D 1/04; H04B 1/10; H04B 15/00
[52] U.S. Cl. ................... 329/192; 375/58; 375/99; 455/63; 455/296
[58] Field of Search ............... 329/104, 110, 131, 132, 329/135, 139, 192; 455/63, 296, 311, 308, 309; 375/1, 58, 99

[56] References Cited

U.S. PATENT DOCUMENTS

| | | | |
|---|---|---|---|
| 3,409,834 | 11/1968 | Cullis et al. | 375/102 |
| 4,270,223 | 5/1981 | Marston | 455/305 |
| 4,272,846 | 6/1981 | Muratani et al. | 455/296 |
| 4,388,723 | 6/1983 | Keen | 375/1 |
| 4,608,701 | 8/1986 | Burgurs et al. | 375/1 |

Primary Examiner—Eugene R. LaRoche
Assistant Examiner—David Mis
Attorney, Agent, or Firm—Antonelli, Terry & Wands

[57] ABSTRACT

To enhance the detection of a desired signal in the presence of interference, the degree of modulation of a received input signal is amplified. In the preferred embodiments, this is accomplished by amplifying the degree of amplitude modulation. This works especially well in situations where constant or substantially constant envelope jamming is employed. However, the arrangement is also effective in some cases where the jamming signal has a rapidly fluctuating envelope. The success of the technique in cases of rapidly fluctuating envelopes depends upon the probability distribution of the envelope.

29 Claims, 7 Drawing Figures 4,710,723

RECEIVER HAVING A MODULATION AMPLIFIER FOR ENHANCING RECEPTION OF A DESIRED SIGNAL IN THE PRESENCE OF INTERFERENCE

FIELD OF THE INVENTION

The present invention is directed to a receiver, and, more particularly, to a receiver capable of enhancing the detection of a desired signal in the presence of interference.

BACKGROUND OF THE INVENTION

Receiving information in the presence of interference has long been a problem in the field of communications. In particular, operation of a receiver in a jamming environment can be especially difficult since a variety of jamming techniques are available which the receiver must contend with. In response to this, an impressive array of antijam (AJ) techniques have been developed. Certainly, one of the most successful developments in this regard has been the introduction of spread spectrum systems which spread the desired transmitted information over a very wide bandwidth by modulating a carrier with a wideband encoding signal. The actual encoding scheme can be selected from one of a variety of options (e.g., chirp, QPSK, FFH, etc.) to permit reception of information in an environment of heavy jamming. The receiver, of course, must be suited to despread and decode the information utilizing circuitry appropriate for the particular encoding scheme employed by the transmitter. A major advantage of such spread spectrum systems is that they permit receiving desired information in situations where a jamming signal is considerably greater than the information signal itself.

Notwithstanding the marked advantages of spread spectrum systems, there is still room for improvement of spread spectrum receivers since, often, certain types of jamming can be quite successful in obscuring information sent with a spread spectrum system. In particular, in some cases, the received information has a power level so far below the jamming level that it becomes quite difficult to fully decipher the desired information. One type of jamming which is often relatively effective is constant envelope jamming which utilizes a signal where the instantaneous power remains substantially fixed. The envelope of such a constant envelope jammer will have no substantial variation, although the phase of the carrier can change. Other techniques which can be difficult to receive information through include systems where plural sinewaves are superimposed on one another to provide a varying envelope or systems which modulate a carrier to produce a uniformly distributed envelope where all envelope levels are equally likely (e.g., as in the case of triangular modulation). These and other jamming techniques can produce either substantially constant envelopes (if the variation is slow relative to the time required for the receiver to receive a single data symbol) or a rapidly varying envelope. In any event, although spread spectrum techniques can be successful against such schemes, these jamming techniques still create considerable difficulties in receiving the information.

SUMMARY OF THE INVENTION

Accordingly, it is an object of the present invention to provide an improved receiver for enhancing the detection of a desired signal in the presence of interference.

It is a further object of the present invention to provide an improved receiver for enhancing the detection of a desired signal in the presence of interference in the form of a jamming signal.

Yet a further object of the present invention is to provide an improved receiver for enhancing the detection of a desired spread spectrum signal having data symbol information in the presence of a jamming signal, especially a jamming signal having a constant or substantially constant envelope over a period of time required for the receiver to receive a single data symbol.

To accomplish these and other objects, the present invention provides a method and apparatus for amplifying the degree of modulation of an input signal which contains a desired signal component and an interfering signal component. More particularly, in the preferred embodiments, the degree of amplitude modulation of the input signal can be amplified to enhance detection of the desired spread spectrum signal component in the input signal in the presence of the interference signal component.

BRIEF DESCRIPTION OF THE DRAWINGS

Other objects and advantages of the present invention may be more clearly understood by reference to the following detailed description and drawings wherein:

FIG. 6 is a graph showing a spectrum analyzer display of an amplitude modulation amplifier output and FIG. 7 is a diagrammatic illustration of the use of a clamping circuit coupled with the circuit configuration shown in FIG. 2.

DETAILED DESCRIPTION

Figure 1:
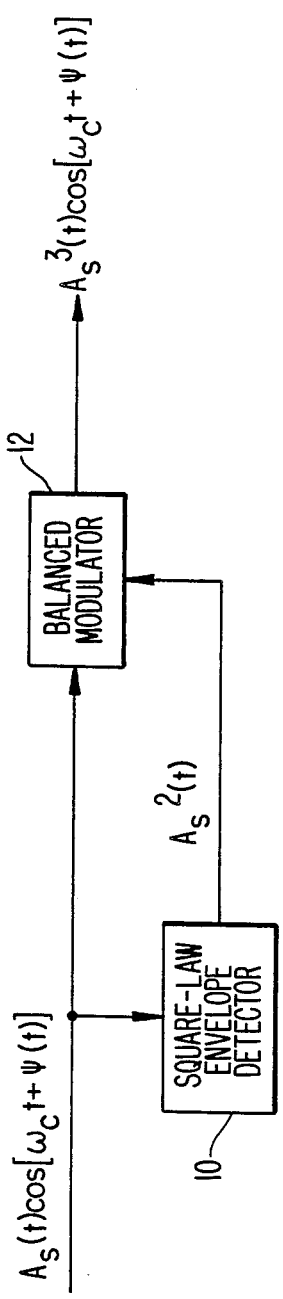
FIGS. 1, 2 and 3 are block diagrams showing respective embodiments of the present invention.
Figure 2:
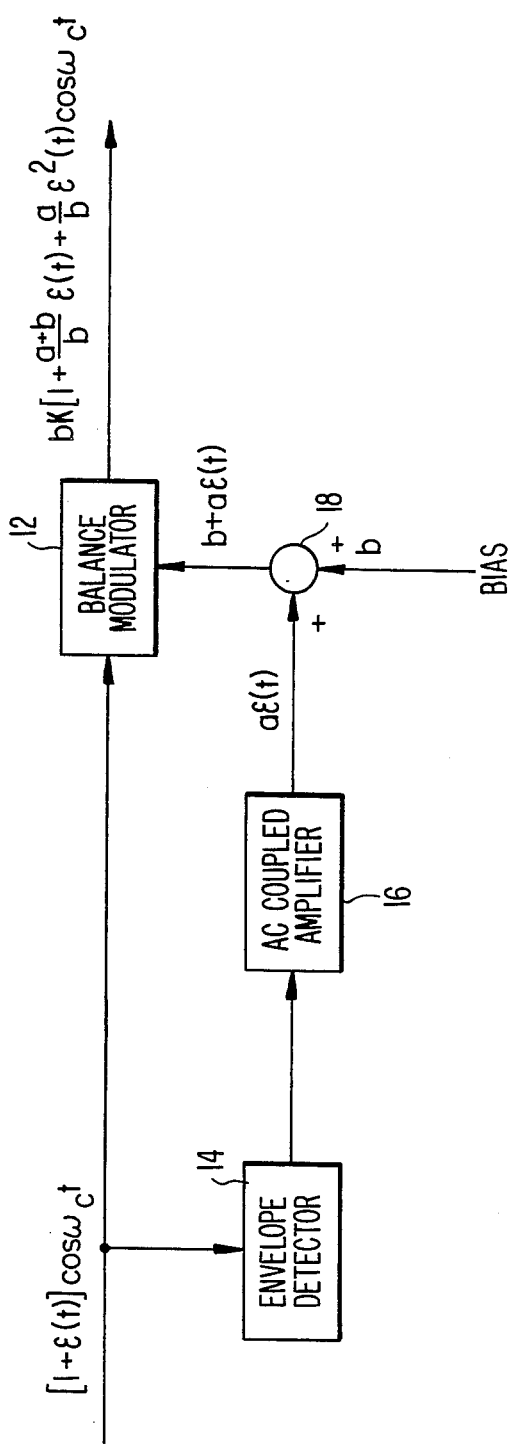
Figure 3:
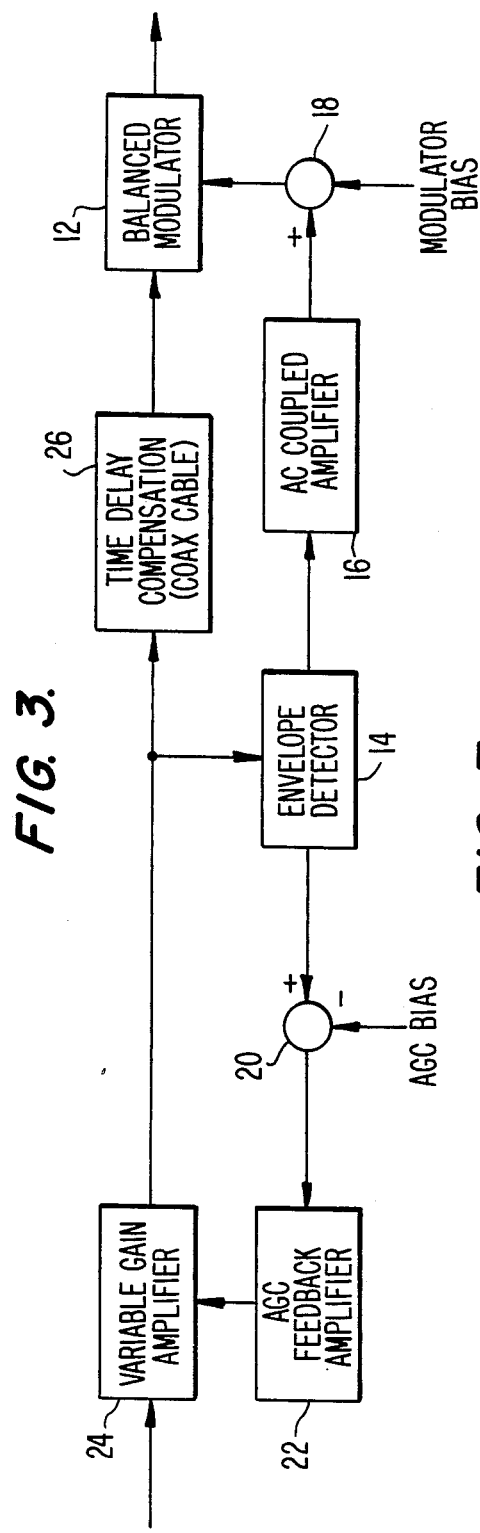

Turning to the drawings, FIGS. 1 through 3 show embodiments of the present invention which illustrate using the principle of the present invention by providing amplitude modulation amplification using an envelope detector and a balanced modulator. Basically, in these embodiments, operation is premised on the fact that the combination of a desired signal (preferably a spread spectrum signal) and a jamming signal will produce a resultant signal having at least some degree of amplitude modulation. This has been found to be the case by the inventors even where both the desired signal and the jamming signal are, by themselves, constant envelope signals having no amplitude modulation. As will be shown in detail by the analysis set forth below, the inventors have found that amplifying this amount of amplitude modulation will, in many cases, significantly improve the signal-to-jammer power ratio. This is especially the case where the envelope of the jammer is either constant or substantially constant during one data symbol of the received information. However, a significant improvement has also been found in certain cases where a rapidly fluctuating envelope exists for the jamming signal, as will be discussed in detail below.

In FIGS. 1 through 3, the amplification is carried out by feeding a balanced modulator both with the input signal (which contains the desired signal and the jamming signal) and with the output of an envelope detector. The combination of the output of the envelope detector with the input signal in the balanced modulator serves to amplify the degree of modulation. It should be noted that the invention is not limited to using a balanced modulator, and other forms of variable gain amplifiers could be used.

Before proceeding further with a discussion of the figures, a background analysis will be provided for an amplitude modulation amplifier (hereinafter abbreviated AMA) and its use in the present invention in the presence of various types of jamming signals.

Analysis of Y'th Law AMA

For analytical convenience, an AMA can be modeled as a bandpass nonlinearity for which the output envelope is the input envelope raised to the power Y and the output phase is equal to the input phase. Thus, if the input envelope has a small fractional modulation $\epsilon(t)$, the output envelope is $$(1+\epsilon(t))^Y \simeq 1+Y\epsilon(t)$$

and the output amplitude modulation is Y times the input amplitude modulation. In other words, in response to a bandpass input, $$A_s(t) \cos [\omega_c t + \Psi(t)]$$

the AMA produces an output proportional to $$A_s^Y(t) \cos [\omega_c t + \Psi(t)].$$

In the mathematical expressions above, Y is the gain of the AMA; $A_s(t), \omega_c$ and $\Psi(t)$ are defined as usual and refer to the instantaneous envelope, carrier frequency, and instantaneous phase, respectively.

Now suppose that the input to the AMA consists of a small bandspread desired signal $$s(t) = a(t) \cos \theta(t) \qquad (1)$$

and a large undesired jammer $$j(t) = A(t) \cos \phi(t) \qquad (2)$$

In equations (1) and (2) A(t) and a(t) denote instantaneous envelopes and $\theta(t)$ and $\phi(t)$ denote instantaneous phase (carrier plus any angle modulation). In what follows the time dependence will no longer be shown explicitly but unless otherwise indicated, A, a, $\theta$ and $\phi$ are to be regarded as functions of time.

With the explicit time dependence suppressed, the input to an antijam receiver is written as $$e_i = j + s = A_s((j=s)/A_s) \qquad (3)$$

where $A_s$ is the instantaneous envelope of the total input (jammer and signal), and the term $$(j+s)/A_s$$

is a constant envelope angle modulated carrier. The envelope $A_s$ is given by $$A_s = [(A + a \cos \Delta)^2 + a^2 \sin^2 \Delta]^{\frac{1}{2}}, \qquad (4a)$$

$$\Delta = \theta - \phi \qquad (4b)$$

Recalling the above definition that the Y'th law AMA raises the input envelope to the power Y while preserving phase, we write the output of the AMA corresponding to the input of Equation (3), as:

$$e_o = A_s^Y((j + s)/A_s) \qquad (5)$$

$$= A_s^{Y-1}(j + s).$$

Now $$A_s^{Y-1} = [(A + a \cos \Delta)^2 + a^2 \sin^2 \Delta]^{((Y-1)/2)} \qquad (6)$$

$$= A^{Y-1}[(1 + (a/A)\cos\Delta)^2 + (a/A)^2 \sin^2 \Delta]^{((Y-1)/2)}$$

$$\simeq A^{Y-1}[1 + (2a/A) \cos \Delta]^{((Y-1)/2)}.$$

In the last equation, the signal-to-jammer amplitude ratio was assumed small compared to unity. In addition, we can write $$A_s^{Y-1} \simeq A^{Y-1}[1+(Y-1)(a/A) \cos \Delta], \qquad (7)$$
$$(a/A)(Y-1) << 1$$

Substituting this last approximation in Equation (5) and using Equations (1) and (2), the output of the AMA is approximated by $$e_o = [A^{Y-1} + A^{Y-2}(\gamma - 1)a \cos \Delta][A \cos\phi + a \cos\theta]$$

$$= A^Y \cos \phi + A^{Y-1}a \cos \theta + A^{Y-1}(\gamma - 1)a \cos \Delta \cos \phi +$$

$$A^{Y-2}(\gamma - 1)a^2 \cos\theta\cos\Delta$$

Consistent with our assumption that $(a/A) << 1$ the last term in the above equation can be neglected. Since $$\cos \Delta \cos \phi = \tfrac{1}{2} \cos (\phi + \Delta) + \tfrac{1}{2} \cos (\phi - \Delta)$$

and $$\phi + \Delta = \phi + \theta - \phi = \theta$$

$$\phi - \Delta = \phi - \theta + \phi = 2\phi - \theta$$

we have $$e_o \simeq A^Y \cos \phi + A^{Y-1}((Y+1)/2)a \cos \theta + A^{Y-1}((Y-1)/2)a \cos (2\phi - \theta) \qquad (8)$$

Now assume that the basic data modulation is binary and antipodal. The data decision is then obtained by multiplying Equation 8 by 2 $\cos\theta$ (despreading) and integrating the result over the duration of a data symbol (matched filtering). Assuming a "+1" to be transmitted, the result is $$e_{MF} = \int_o^{T_s} [A^Y \cos(\phi - \theta) + A^{Y-1}((\gamma + 1)/2)a + A^{Y-1}((\gamma - 1)/2)a\cos(2\phi - 2\theta)]dt \qquad (9)$$

The first term in the above equation is due to the jammer, the second term is the desired signal, and the third term is a third order intermodulation product. By proper choice of the spreading function $\theta$, this intermodulation product is wideband and can be neglected as small compared with the first term. We make this assumption and write the output of the matched filter as $$e_{MF} = \int_0^{T_s} \left[ A^\gamma \cos(\phi - \theta) + A^{\gamma-1} \frac{\gamma+1}{2} a \right] dt \qquad (10)$$

Now if the jammer envelope is constant $$A(t) = A_o$$

it is clear from Equation (10) that the effect of the AMA is to increase the jammer power out of the matched filter by a factor $A_o^{2\gamma}/A_o^2$ and to increase the signal power by the factor $$\left( A_o^{\gamma-1} \frac{\gamma+1}{2} \right)^2$$

Therefore, the signal-to-noise ratio is improved by the factor $$I_F = A_o^{2\gamma-2} \left( \frac{\gamma+1}{2} \right)^2 \frac{A_o^2}{A_o^{2\gamma}} = \left( \frac{\gamma+1}{2} \right)^2 \qquad (11)$$

This result also applies if A(t) varies slowly but is essentially constant during a data symbol.

Now suppose that A(t) fluctuates rapidly during a symbol time but not so fast as to alter the spectrum of the jammer at the output of the despreader. In this situation we can argue that the effect of the AMA is to increase the effective jammer power at the output of the matched filter by the factor $$\overline{A^{2\gamma}}/\overline{A^2}$$

and to increase the effective signal power by $$\left( A^{\gamma-1} \frac{\gamma+1}{2} \right)^2$$

Hence, the signal-to-noise improvement is $$I_F = \frac{(\overline{A^{\gamma-1}})^2 \overline{A^2}}{\overline{A^{2\gamma}}} \left( \frac{\gamma+1}{2} \right)^2 \qquad (12)$$

In the last three expressions, the bars indicate averaging operations.

In summarizing and simplifying the above discussion, for an input jammer waveform of $$j(t) = A(t) \cos \phi(t)$$

and a signal waveform $$s(t) = a(t) \cos \theta(t)$$

the output of the AMA can be approximated as:

$$e_o(t) = A^{\gamma-1}(t)[j(t) + ((\Upsilon+1)/2)s(t) + ((\Upsilon-1)/2)\hat{s}(t)],$$

$$\Upsilon a(t) << A(t) \qquad (13)$$

where $\hat{s}(t)$ is a third order intermodulation product $$\hat{s}(t) = a(t) \cos [2\phi(t) - \theta(t)]. \qquad (14)$$

As noted previously, in a well designed spread spectrum system, the effect of $\hat{s}(t)$ is generally negligible, unless the jammer is phase coherent. In this regard, it is interesting to note that a third order intermodulation product is also generated in devices which compress amplitude modulation, e.g., limiters. However, in pseudo noise (PN) spread systems phase coherence problems are avoided by using QPSK spreading. Thus, for constant envelope jammers, Equation (13) shows that the AMA improves the signal-to-jammer power ratio by a factor $(\Upsilon+1)^2/4$. This improvement factor also applies if the jammer envelope is essentially constant during one data symbol. Also, for jammers having a rapidly fluctuating envelope, the signal-to-jammer power ratio is improved approximately by a factor, $I_F$, given by Equation (12) above.

Equation (12) has been evaluated by the inventors for a large number of cases. Sample results are given in Tables I, II and III.

TABLE I

| IMPROVEMENT FACTOR FOR UNIFORMLY DISTRIBUTED ENVELOPE | |
|---|---|
| $\gamma$ | 10 log $I_F$ |
| 2 | .28 |
| 3 | .15 |
| 4 | .70 |
| 5 | 1.207 |

TABLE II

| IMPROVEMENT FACTOR FOR SINUSOIDAL ENVELOPE | |
|---|---|
| $\gamma$ | 10 log $I_F$ |
| 3 | 2.0 |
| 5 | 4.1 |
| 7 | 5.7 |

TABLE III

| IMPROVEMENT FACTOR FOR RAYLEIGH ENVELOPE JAMMER | |
|---|---|
| $\gamma$ | 10 log $I_F$ |
| 2 | −.55 |
| 3 | −1.76 |
| 4 | −3.37 |
| 5 | −5.2 |
| 7 | −9.4 |

In Table I, the jammer envelope is assumed to have a uniformly distributed value between zero and some maximum value. Thus, in such an arrangement, all envelope levels are equally likely. An example of this would be a triangularly modulated signal. Table II and Table III show corresponding results for a jammer made up of two equal sinewaves offset from one another (positive cycles only) and for a Gaussian jammer, respectively. Thus, for constant envelope jammers, the approximate theory predicts large improvement factors for large AMA gain Y. For a jammer with a rapidly fluctuating envelope, the performance depends on the probability distribution of the envelope. For a Gaussian jammer (strictly not peak limited), the AMA produces a performance degradation which increases as the gain of the AMA increases.

Figure 4:
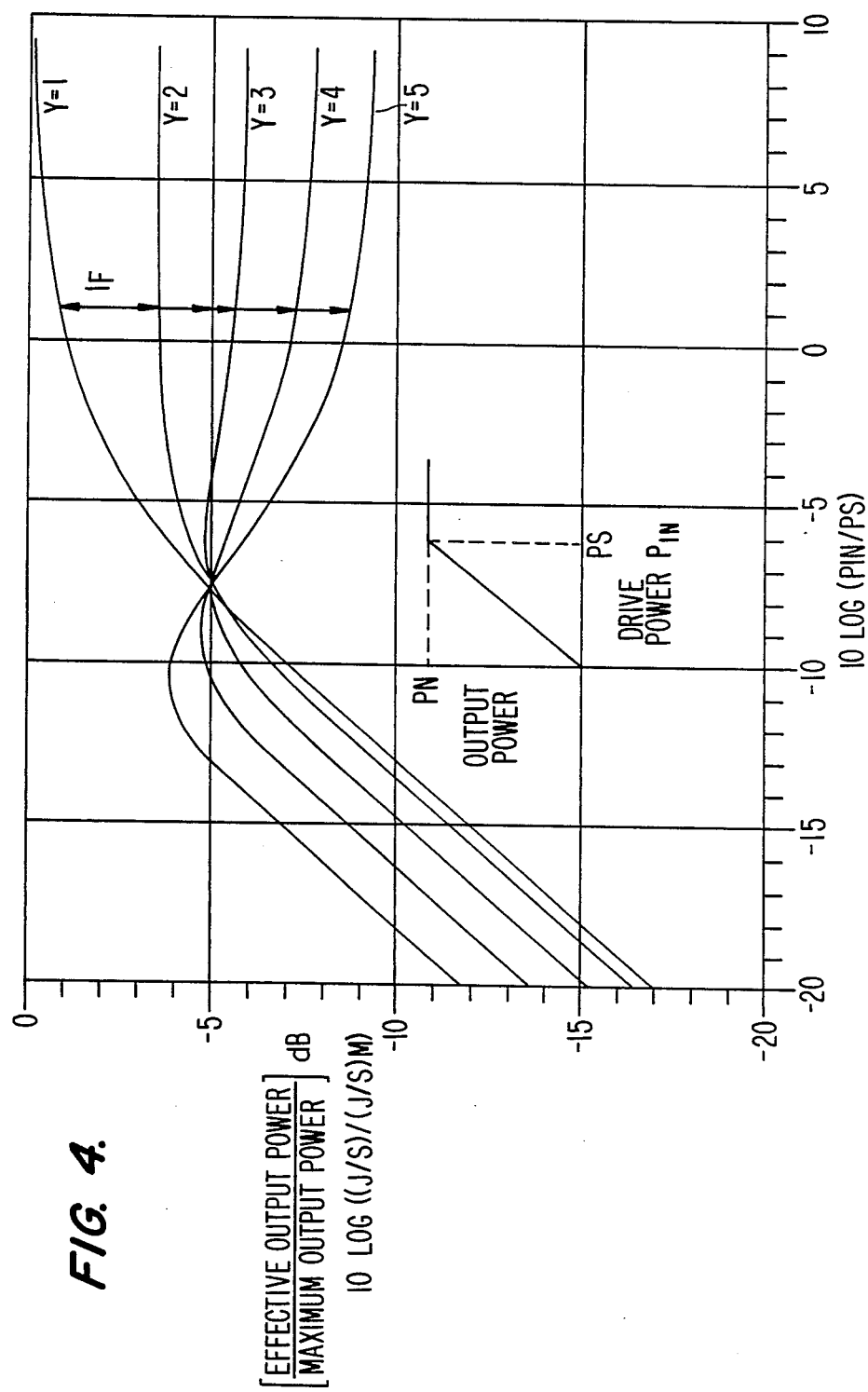
FIG. 4 is a graph showing the effect of a peak envelope constraint for different values of amplitude modulation amplification gain with a Gaussian jammer.

The performance of the idealized (infinite dynamic range) AMA is poor with jammers having a large peak- /average power ratio. However, to exploit this weakness of the AMA, a peak power limited jammer must reduce its average power. FIG. 4 shows the effect of a peak envelope constraint for different values of AMA gain with a Gaussian jammer. The vertical axis is the effective jammer power normalized to the maximum jammer power. The horizontal axis is the jammer drive level relative to the clipping level. For a given drive level, the difference between the Y=1 curve and, say, the Y=5 curve, is the improvement factor as computed from Equation (12) for Y=5 and for a suitably clipped Rayleigh distribution. For large drive levels, the jammer approaches a constant envelope and the improvement due to the AMA approaches $$10 \log ((Y+1)/2)^2$$

For low drive levels, the jammer envelope approaches a true Rayleigh and the improvement (loss) due to the AMA appraoches the results given in Table III. If a jammer knows that an AMA is used, he will increase his effectiveness by reducing his drive level, thereby reducing the performance gain due to the AMA. He should continue this process until the loss in output power becomes the significant factor. Note that an AMA gain of 3:1 produces at least 5 dB of performance improvement when the jammer optimizes his drive level.

AMA Implementation

Returning now to the embodiments for implementing the present invention, FIG. 1 shows a Y=3 AMA. The input (which is a combination of a desired signal and a jammer signal) is applied to a square law detector 10 to give the square of the input envelope which in turn drives a balanced modulator (multiplier) 12 to give the desired output with the output envelope raised to the power of 3. This AMA configuration has a fixed gain of 3:1 and the output dynamic range is three times the input dynamic range (in dB).

FIG. 2 shows an embodiment which is easier to implement in practical usage, and which has more flexibility regarding amplification control. Note that the square law envelope detector 10 has been replaced by a linear envelope detector 14. Also, the detector output is amplified with an AC coupled amplifier 16; the DC bias thus removed can be reinserted after amplification by way of an adder 18. The output of the adder is then applied to the balanced modulator 12 to again obtain the desired output. The transfer characteristics of this AMA are readily obtained and are shown in FIG. 2. For a small input envelope fluctuation, $\epsilon(t)$, the output envelope fluctuation is approximately $(a+b)/b$ $\epsilon(t)$ and hence the AMA has a gain of $(a+b)/b$. Thus, the AMA gain can be adjusted by varying either a, the gain of the envelope detector/AC coupled amplifier combination, or by varying the bias b.

FIG. 2 shows the input envelope as having unit average value $(1+\epsilon(t))$. In practice, this can be achieved with an automatic gain control (AGC) circuit sharing the envelope detector 14 used in the AMA. The overall block diagram of such an arrangement is shown in FIG. 3 with like numerals denoting like elements to FIG. 2. In particular, an output of the envelope detector 14 is applied to an adder circuit 20 for adding an AGC bias to the detected envelope. The output of the adder 20 is, in turn, fed to an AGC feedback amplifier 22 which controls a variable gain amplifier 24 which receives the input signal. By appropriate selection of the gain values, the input signal can be controlled to provide a unit average value to the balanced modulator, as shown in FIG. 3. Basically, the purpose of this is to provide the balanced modulator 12 with a value within its effective operating range to permit satisfactory operation of the balanced modulator 12. As such, although a unit value of $(1+\epsilon(t))$ has been shown, the AGC circuit could function to provide other values, if desired, as long as these were within the effective operating range of the balanced modulator 12.

In addition to the AGC circuit arrangement, FIG. 3 also shows the use of a time delay compensation circuit 26 (such as a coax cable or other appropriate delay circuit). This time delay compensation circuit 26 suitably delays application of the input signal to the balanced modulator 12 until the time when the output of the adder 18 is applied to the other input of the balanced modulator. The circuit 26 can consist of a coax cable cut to have nominally the same delay time as the combination of the envelope detector 14, the amplifier 16 and the adder 18. In this way, the balanced modulator can carry out its operation of combining the input signal with the adder output to produce the desired output shown in FIG. 2.

The output of the embodiments of FIGS. 1 through 3 are preferably fed to the input of a conventional spread spectrum receiver for despreading and decoding the received information. In fact, a significant advantage of the present invention is that it can readily be implemented at the input of an existing conventional antijam despreading receiver to provide the improvement discussed in this case. The output of the despreader is, in turn, passed through a matched filter to make a desired data decision, as discussed previously in the theoretical analysis.

With regard to the encoding of data on the received signal, preferably a spread spectrum system is used having angular modulation encoding such as QPSK or another angular modulation coding technique of the type commonly used in spread spectrum systems for information transmission. As such, the desired signal itself can have a constant envelope. However, the invention is not limited only to techniques where the desired signal has a constant envelope, and, if desired, the information itself can be transmitted using amplitude modulation.

Figure 5:
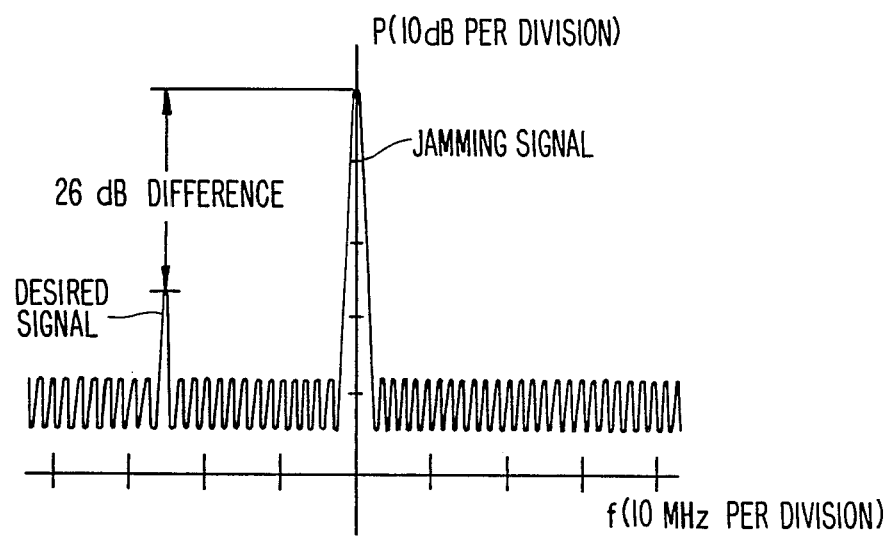
FIG. 5 is a graph showing a spectrum analyzer display of the amplitude modulation amplifier input signal.
Figure 6:
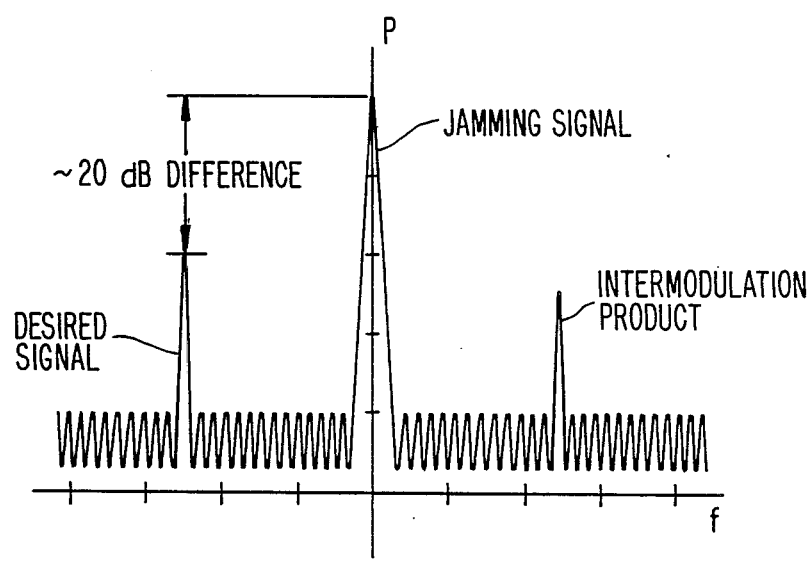

An operating example of the embodiment of FIG. 3 will now be given. Initially the AMA gain was adjusted by applying a modulated carrier with 10% AM modulation and varying the bias to obtain an output with 30% AM modulation. This corresponds to an AMA gain of 3:1 (Y=3). Then two sinewaves (65 MHz and 75 MHz) were applied at the input to simulate a small signal and a jammer. The jammer was set to be 26 dB stronger than the signal. FIGS. 5 and 6 show spectrum analyzer displays of the AMA input and output spectrum, respectively. As discussed previously, an AMA gain of 3 should give a signal-to-jammer ratio improvement of $$10 \log ((Y+1)/2)^2 = 10 \log (4) = 6 \text{ dB}$$

Also, the third order intermodulation factor should be $$10 \log ((Y-1)/(Y+1)^2 = 10 \log (2/4)^2 = -6 \text{ dB}$$

relative to the signal.

Thus, the signal and the third intermodulation product should be 20 dB and 26 dB, respectively, below the jammer at the output of the AMA. From FIG. 6 one might estimate the corresponding experimental figures to be 19.5 dB and 24.5 dB, respectively.

Next, the small signal was replaced by a QPSK PN spread signal with PSK data modulation. The AMA output from the balanced modulator 12 was applied to a PN receiver using a rate ½ maximum likelihood decoder. The signal level was then adjusted to produce an output error rate of $10^{-5}$. The AMA was then removed and the jammer and signal were applied directly to the PN receiver for comparison purposes. It was then found that the signal level had to be increased by nearly 6 dB in order to obtain the same error rate of $10^{-5}$.

Similar test were conducted with a Gaussian jammer and a two-sinewave jammer (having 10 MHz spacing). In the Gaussian noise jammer case, the AMA resulted in a performance loss of 1 dB compared to the 1.8 dB theoretical value given in Table III, Section 2. For the two equal sinewave cases, the AMA produced a performance gain of 1.5 dB compared to the theoretical value of 2.0 dB given in Table II, Section 2. These discrepancies may well be the result of the fact that the test circuit has a gain of 3:1 only for small amplitude fluctuations. For large positive fluctuations, the balanced modulator saturates while for large negative fluctuations, the envelope detector and balanced modulator threshold and the AMA output goes to zero. The saturation characteristic is to some extent desirable and actually improves performance with short pulse jammers. However, excessive large positive fluctuations can cause the AC amplifier to drive the balanced modulator to excessive output levels. Also, the threshold characteristic, caused by large negative fluctuations, is generally undesirable. Both of these problems can be eliminated by suitably clamping the baseband control voltage into the balanced modulator 12. FIG. 7 illustrates such an arrangement with a clamping circuit 30 coupled between the output of the adder 18 and the input of the balanced modulator 12. FIG. 7 also shows the voltage characteristic of this clamping circuit 30. As can be seen there, the clamping circuit 30 restricts the control voltage fed to the balanced modulator to a range which will prevent the problems noted above. Of course, the clamping means could be provided between the AC coupled amplifier and the adder 18, if desired.

Although the invention has been illustrated with regard to embodiments of FIGS. 1 through 3, it should be recognized that modifications of these are readily possible while still falling within the scope of the present invention. For example, although the use of a balanced modulator is preferred due to its desirable operational characteristics and its ready availability, other forms of variable gain devices could be used to practice the present invention by amplifying an input signal under the control of the output of an envelope detector arrangement. Similarly, other gain control arrangements than that shown could be provided between the output of the envelope detector and the input of the balanced modulator. Similarly, although it has been previously noted that the preferred location of the AMA of the present invention is at the input of a despreader for a spread spectrum system, it would be possible to locate the AMA further inside of the receiving circuitry (for example, between the despreader and the matched filter). However, for bandwidth considerations, it is generally preferable to locate the AMA prior to the despreader, as discussed previously.

Although the present invention has been described in detail for amplifying the amplitude modulation on the received signals, it is possible to implement the principle of the present invention for phase modulation as well. In FIGS. 2 and 3, for example, the envelope detector can be replaced by a PM detector (made of, for example, a frequency discriminator with an integrator at the output thereof) and the balanced modulator can be replaced by a PM modulator to produce a PM amplifier. This type of arrangement would be particularly useful, for example, in cases where the input signal has, for some reason, been limited to remove all amplitude modulation. This could occur, for instance, in a case where the desired signal and the jamming signal passed through a satellite relay having a limiter. The limiter in the satellite would remove substantially all of the amplitude modulation which would normally result from combining the jamming signal with the desired signal. Thus, the AMA discussed in this case as the preferred embodiment would not be effective. However, using PM amplification instead would yield similar results to the AM amplification discussed previously in terms of improving the power ratio of the desired signal to the jamming signal. Also, in some instances, a combination of the AM and PM amplification could be used, if desired.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A receiver for receiving an input signal containing a desired signal component and an interference signal component, wherein the improvement comprises means for amplifying the degree of a prescribed modulation of the input signal to enhance detection of the desired signal component in the input signal in the presence of said interference signal component.

2. A receiver according to claim 1, wherein said amplifying means comprises means for amplifying the degree of amplitude modulation of said input signal.

3. A receiver according to claim 2, wherein said amplifying means comprises means for amplifying the degree of amplitude modulation of said input signal by raising an instantaneous envelope of said input signal to a power of Y.

4. A receiver according to claim 1, wherein said amplifying means comprises means for amplifying the degree of amplitude modulation of said input signal by raising an instantaneous envelope of said input signal to a power of Y to produce an output signal having an output envelope equal to the input envelope raised to the power Y and having an output phase substantially equal to the phase of the input signal.

5. A receiver according to claim 1, wherein said amplifying means comprises means for amplifying the degree of phase modulation of said input signal.

6. A receiver for receiving an input signal containing a desired signal component and an interference signal component, comprising:

means for detecting an envelope of said input signal; and means, coupled to said envelope detecting means, for amplifying said input signal in accordance with an output of said envelope detecting means so as to increase the degree of amplitude modulation of the input signal and enhance detection of the desired signal component of said input signal in the presence of said interference signal component.

7. A receiver according to claim 6, wherein said amplifying means comprises a balanced modulator having a first input coupled to receive said input signal and a second input coupled to receive an output of said envelope detecting means.

8. A receiver according to claim 6, wherein said envelope detecting means comprises a square law envelope detector.

9. A receiver according to claim 7, wherein said envelope detecting means comprises a square law detector.

10. A receiver according to claim 6, wherein said envelope detector comprises a linear envelope detector, and wherein said receiver further comprises an AC coupled amplifier coupled to an output of said linear envelope detector to amplify a fluctuation $\epsilon(t)$ of said input signal by a factor $\alpha$ to provide a signal $\alpha\epsilon(t)$, and a combining means coupled to an output of said AC coupled amplifier to add a bias b to said output to produce a signal $b+\alpha\epsilon(t)$ to couple to said amplifying means.

11. A receiver according to claim 7, wherein said envelope detector comprises a linear envelope detector, and wherein said receiver further comprises an AC coupled amplifier coupled to an output of said linear envelope detector to amplify a fluctuation $\epsilon(t)$ of said input signal by a factor $\alpha$ to provide a signal $\alpha\epsilon(t)$, and a combining means coupled to an output of said AC coupled amplifier to add a bias b to said output to produce a signal $b+\alpha\epsilon(t)$ to couple to said second input of said balanced modulator.

12. A receiver according to claim 11, further comprising a time delay compensation circuit coupled to the first input of said balanced modulator to provide a time delay to said input signal substantially equal to a time delay of said envelope detector, said AC coupled amplifier and said combining means.

13. A receiver according to claim 11, further comprising an automatic gain control loop coupled between an output of said envelope detector and said first input of said balanced modulator to provide said input signal with an input envelope having a predetermined average value.

14. A receiver according to claim 12, further comprising an automatic gain control loop coupled between the output of said envelope detector and an input of said time delay compensation circuit to provide said input signal with an input envelope having a predetermined average value.

15. A receiver according to claim 6, further comprising clamping means coupled between said envelope detecting means and said amplifying means for clamping a control voltage provided from said envelope detecting means to said amplifying means to fall within a predetermined range.

16. A receiver according to claim 10, further comprising clamping means coupled between said AC coupled amplifier and said amplifying means for clamping the control voltage provided from said AC coupled amplifier to said amplifying means to fall within a predetermined range.

17. A receiver according to claim 6, wherein an output signal of said amplifying means has the same phase as said input signal.

18. A receiver for receiving an input signal having a jamming signal component and a desired spread spectrum signal component containing a predetermined data symbol information, comprising:
    means for detecting an envelope of said input signal;
    variable gain amplifying means coupled to receive said input signal at a first input thereof; and
    means coupled between an output of said envelope detector and a second input of said variable gain amplifying means to increase the amplification of the output of said envelope detector,
    wherein said variable gain amplifying means includes means for amplifying the input signal received at said first input thereof under the control of the amplified signal received at said second input thereof to enhance the detection of the desired spread spectrum signal component in said input signal in the presence of said jamming signal component.

19. A receiver according to claim 18, wherein said variable gain amplifying means comprises a balanced modulator.

20. A receiver according to claim 18, wherein an output signal of said variable gain amplifying means has the same phase as said input signal.

21. A method of processing a received input signal containing a desired signal component and an interference component, said method comprising amplifying the degree of a prescribed modulation of said input signal to enhance the detection of the desired signal component in the input signal in the presence of said interference signal component.

22. A method according to claim 21, wherein said amplifying step comprises amplifying the degree of amplitude modulation of said input signal.

23. A method according to claim 21, wherein said amplifying step comprises amplifying the degree of amplitude modulation of said input signal by raising an instantaneous envelope of said input signal by a power of Y.

24. A method according to claim 21, wherein said amplifying step comprises amplifying the degree of amplitude modulation of said input signal by raising an instantaneous envelope of said input signal by a power of Y to produce an output signal having an output envelope equal to the input envelope raised to the power Y and having an output phase equal to the phase of the input signal.

25. A method according to claim 21, wherein said amplifying step comprises amplifying the degree of phase modulation of said input signal.

26. A method of processing a received input signal containing a desired signal component and an interference signal component comprising the steps of:
    (a) detecting an envelope of said input signal; and
    (b) amplifying said input signal in accordance with the envelope of the input signal detected in step (a) so that the degree of amplitude modulation of the input signal is increased to enhance detection of the desired signal component in said input signal in the presence of said interference signal component.

27. A method according to claim 26, wherein an output signal of said amplifying step has the same phase as said input signal.

28. A method of processing a received input signal containing a desired spread spectrum signal component containing predetermined data symbol information and a jamming signal component wherein said jamming signal component has a substantially constant envelope for a period of time corresponding to a period required for reception of a single data symbol, comprising the steps of:

(a) detecting an envelop of said input signal; and
(b) amplifying said input signal in accordance with the envelope of the signal detected in step (a) so that the degree of amplitude modulation of said input signal is increased to enhance detection of the desired spread spectrum signal component in said input signal in the presence of said interference signal component.

29. A method according to claim 28, wherein an output signal of said amplifying step has the same phase as said input signal.

* * * * *